(12) United States Patent
Wayman et al.

(10) Patent No.: US 7,518,863 B2
(45) Date of Patent: Apr. 14, 2009

(54) MODULARIZED RADIO FREQUENCY BAND COMPONENTS ON REMOVABLE DOORS

(75) Inventors: Michael J. Wayman, Waconia, MN (US); Dean Zavadsky, Shakopee, MN (US); Philip M. Wala, Waseca, MI (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/692,026

(22) Filed: Mar. 27, 2007

(65) Prior Publication Data
US 2008/0238270 A1 Oct. 2, 2008

(51) Int. Cl.
*H05K 7/20* (2006.01)
*F28F 7/00* (2006.01)
*A47B 96/00* (2006.01)
*A47B 49/00* (2006.01)

(52) U.S. Cl. .............. 361/690; 165/80.3; 165/185; 312/199; 312/236; 312/223.1; 361/610; 361/704; 361/715

(58) Field of Classification Search .......... 361/724, 361/823, 827, 829; 312/223.1, 236, 257.1, 312/265.1–265.3, 283, 285, 324
See application file for complete search history.

(56) References Cited

U.S. PATENT DOCUMENTS

| | | | | | |
|---|---|---|---|---|---|
| 3,654,663 | A | * | 4/1972 | Algotsson | 16/230 |
| 5,001,602 | A | * | 3/1991 | Suffi et al. | 361/724 |
| 5,292,189 | A | * | 3/1994 | Lau et al. | 312/265.3 |
| 5,380,083 | A | * | 1/1995 | Jones et al. | 312/265.3 |
| 5,388,903 | A | * | 2/1995 | Jones et al. | 312/334.29 |
| 5,407,263 | A | * | 4/1995 | Jones et al. | 312/265.1 |
| 5,540,339 | A | * | 7/1996 | Lerman | 211/26 |
| 6,065,612 | A | * | 5/2000 | Rinderer | 211/26 |
| 6,238,027 | B1 | * | 5/2001 | Kohler et al. | 312/265.1 |
| 6,411,515 | B1 | * | 6/2002 | Sakamoto et al. | 361/704 |
| 6,968,647 | B2 | * | 11/2005 | Levesque et al. | 49/192 |
| 7,225,586 | B2 | * | 6/2007 | Levesque et al. | 49/506 |
| 2004/0029617 | A1 | | 2/2004 | Flynn | |
| 2007/0247809 | A1 | * | 10/2007 | McClure | 361/695 |

FOREIGN PATENT DOCUMENTS

| | | |
|---|---|---|
| DE | 29711262 | 9/1997 |
| DE | 19939614 | 9/2001 |
| EP | 1694084 | 8/2006 |
| WO | 0028753 | 5/2000 |

* cited by examiner

*Primary Examiner*—Gregory D Thompson
(74) *Attorney, Agent, or Firm*—Fogg & Powers LLC

(57) ABSTRACT

A cabinet system comprises a chassis having a plurality of openings, a plurality of modular doors, and at least one radio frequency system. Each opening has removably attached chassis-hinge portions on one of two edges. Each modular door comprises an outside surface, an inside surface opposing the outside surface, and door-hinge receptacles on at least two edges. The door-hinge receptacles receive door-hinge portions. Each door-hinge portion is positioned in a respective door-hinge receptacle on one edge of the plurality of modular doors and is configured to mate with a respective chassis-hinge portion on the one edge of one of the plurality of openings so the mated chassis-hinge portion and door-hinge portion form a hinge to rotatably attach the modular door to the one of the openings. The radio frequency system comprises electronic components attached to the inside surface of at least one of the plurality of modular doors.

29 Claims, 9 Drawing Sheets

MODULARIZED RADIO FREQUENCY BAND COMPONENTS ON REMOVABLE DOORS

CROSS REFERENCE TO RELATED APPLICATIONS

This application is related to U.S. patent applications Ser. No. 11/691,963 having a title of "A MULTI-FUNCTIONAL HINGE" U.S. patent applications Ser. No. 11/691,970 having a title of "APPARATUS FOR TRANSFERRING HEAT BETWEEN TWO CORNER SURFACES", U.S. patent applications Ser. No. 11/692,014 having a title of "CLAMSHELL CHASSIS ASSEMBLY", U.S. patent applications Ser. No. 11/692,000 having a title of "COMBINED-NATURAL-AND-FORCED-CONVECTION HEAT SINK", and U.S. patent applications Ser. No. 11/691,980 having a title of "APPARATUS FOR IMPROVING THE ACCESSIBILITY OF A MOUNTED STRUCTURE" all of which are filed on the same date herewith. Application Ser. No. 11/691,963, application Ser. No. 11/691,970, application Ser. No. 11/692,014, application Ser. No. 11/692,000, and application Ser. No. 11/691,980 are hereby incorporated herein by reference.

BACKGROUND

Cabinet systems used to enclose electronic components in outdoor environments are securely enclosed by doors that are bolted to a chassis to prevent damage to the electronic components from debris and from the elements of weather, such as rain and snow. The electronic components emit heat which can be slow to dissipate from the cabinet causing heat damage to the electronic components, particularly when the cabinet is located in hot climates. During maintenance of the electronic components in the cabinet, the doors are unbolted and removed to expose the electronic components. It would be easier if the doors were hinged to allow the door to swing open once the bolts are removed from the cabinet doors. However, the cabinets are often mounted in places that limit the swinging movement of doors on the cabinets to one direction. If the cabinet doors are hinged, a customer must identify which type of cabinet door is needed for a given cabinet at every location. This can be onerous on the customer since they may not know the physical restrictions of a given location until the cabinet is installed at the location.

SUMMARY

In a first embodiment, a cabinet system comprises a chassis having a plurality of openings, a plurality of modular doors, and at least one radio frequency system. Each opening has removably attached chassis-hinge portions on one of two edges. Each modular door comprises an outside surface, an inside surface opposing the outside surface, and door-hinge receptacles on at least two edges. The door-hinge receptacles receive door-hinge portions. Each door-hinge portion is positioned in a respective door-hinge receptacle on one edge of the plurality of modular doors and is configured to mate with a respective chassis-hinge portion on the one edge of one of the plurality of openings so the mated chassis-hinge portion and door-hinge portion form a hinge to rotatably attach the modular door to the one of the openings. The radio frequency system comprises electronic components attached to the inside surface of at least one of the plurality of modular doors.

In a second embodiment, a modular door fits within an opening in a chassis. The modular door comprises a heat sink forming a main body of the modular door and door-hinge receptacles on at least two edges of the modular door. The heat sink has a fin surface and a substantially flat surface. The fin surface forms at least a portion of the outside surface of the modular door and the substantially flat surface forms an inside surface of at least a portion of the modular door. The door-hinge receptacles receive door-hinge portions. The heat generated by electronic components is thermally conducted to the fin surface for dissipation outside the chassis when the electronic components are operably attached to the substantially flat surface and the modular door is affixed to cover an opening in the chassis to enclose the electronic components.

In a third embodiment, modular doors enclose electronic components in a chassis. Each modular door comprises a plurality of electronic components operably attached to an inside surface of the modular door. The electronic components on the plurality of modular doors are operable within a selected frequency range within a range of frequencies.

In a fourth embodiment, a cabinet system comprises a chassis, and a plurality of modular doors. The chassis comprises a plurality of openings having chassis-hinge portions on at least two edges of the openings. Each of the plurality of modular doors comprises an outside surface, an inside surface opposing the outside surface, and door-hinge receptacles on at least two edges of each of the plurality of modular doors. The door-hinge receptacles receive door-hinge portions. Each door-hinge portion that is positioned in a respective door-hinge receptacle on one edge of the plurality of modular doors is configured to mate with a respective chassis-hinge portion on the one edge of one of the plurality of openings so the mated chassis-hinge portion and door-hinge portion form a hinge to rotatably attach the modular door to the one of the plurality of openings adjacent to the mated-chassis-hinge portion.

In a fifth embodiment, a method of reconfiguring a cabinet system comprises unbolting a modular door from a chassis of the cabinet system housing a radio frequency system, rotating the modular door about a pivot axis of a hinge on a first edge of an opening in the chassis, and lifting the modular door from chassis-hinge portions of the hinge. The modular door includes electronic components for a subband of the radio frequency system. The chassis-hinge portions are removably attached at the first edge of the opening and the lifting separates the modular door from the chassis.

DRAWINGS

Figure 1:
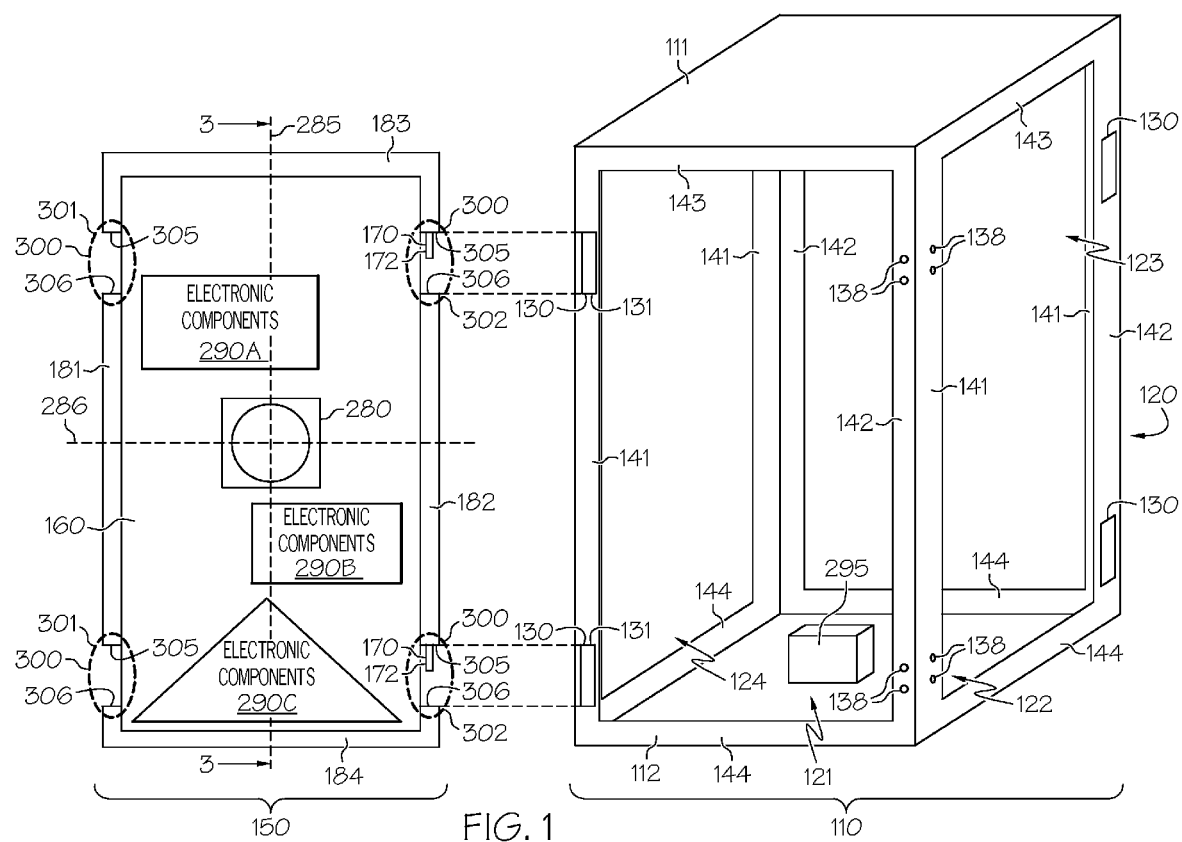
FIG. 1 is a block diagram representative of an exploded view of an embodiment of a chassis and a modular door.

In accordance with common practice, the various described features are not drawn to scale but are drawn to

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Some embodiments of the present invention provide a cabinet system with modular doors that include built-in heat sinks upon which the electronic components are mounted. The heat generated by the electronic components is dissipated through the modular doors when the electronic components on the surface of the heat sink, which is also the inside surface of the modular door, are enclosed within the cabinet. Some embodiments of the modular doors also include a hinge system that allows the installer of the cabinet system to choose which edge of the modular door to attach to the chassis of the cabinet during the installation.

Some embodiments of the modular doors also include the electronic components required to operate at one band or sub-band of radio frequency transmission and reception. If a customer needs to change the operational bandwidth of the electronic components in the cabinet, the modular door for one radio frequency band is replaced with a modular door of another radio frequency band. In one implementation of this embodiment, the customer attaches a blank door to the chassis to provide necessary sealing and weather protection and when additional operational bandwidths are required, the modular door for the desired band replaces the blank door.

The electronic components on the modular doors are electronically connected to the system electronic components required to control the radio frequency electronic components 290 mounted on the modular door 150. The system electronic components can be positioned within the chassis and not on the modular doors. In one implementation of this embodiment, an electrical-cable attachment is positioned at the center of the modular door to support and guide the cables from the modular door to the centrally located system electronic components.

Some embodiments of the modular doors also are configured so that the electronic components on the inside surface of the door are arranged by height to permit a plurality of modular doors with attached electronic components to be closed on the chassis so that the electronic components fill the maximum volume of space within the cabinet without interfering each other (touching each other). This permits the cabinet system to be reduced in size. In one implementation of this embodiment, the electronic components on the inside surface of the modular door are arranged symmetrically by height about at least one plane that bisects the modular door. In another implementation of this embodiment, the electronic components on the inside surface of the modular door are arranged symmetrically by height about at least one plane that bisects the electrical-cable attachment positioned at the center of the modular door. Embodiments of the modular doors can include one or more of the above mentioned embodiments.

Figure 2A:
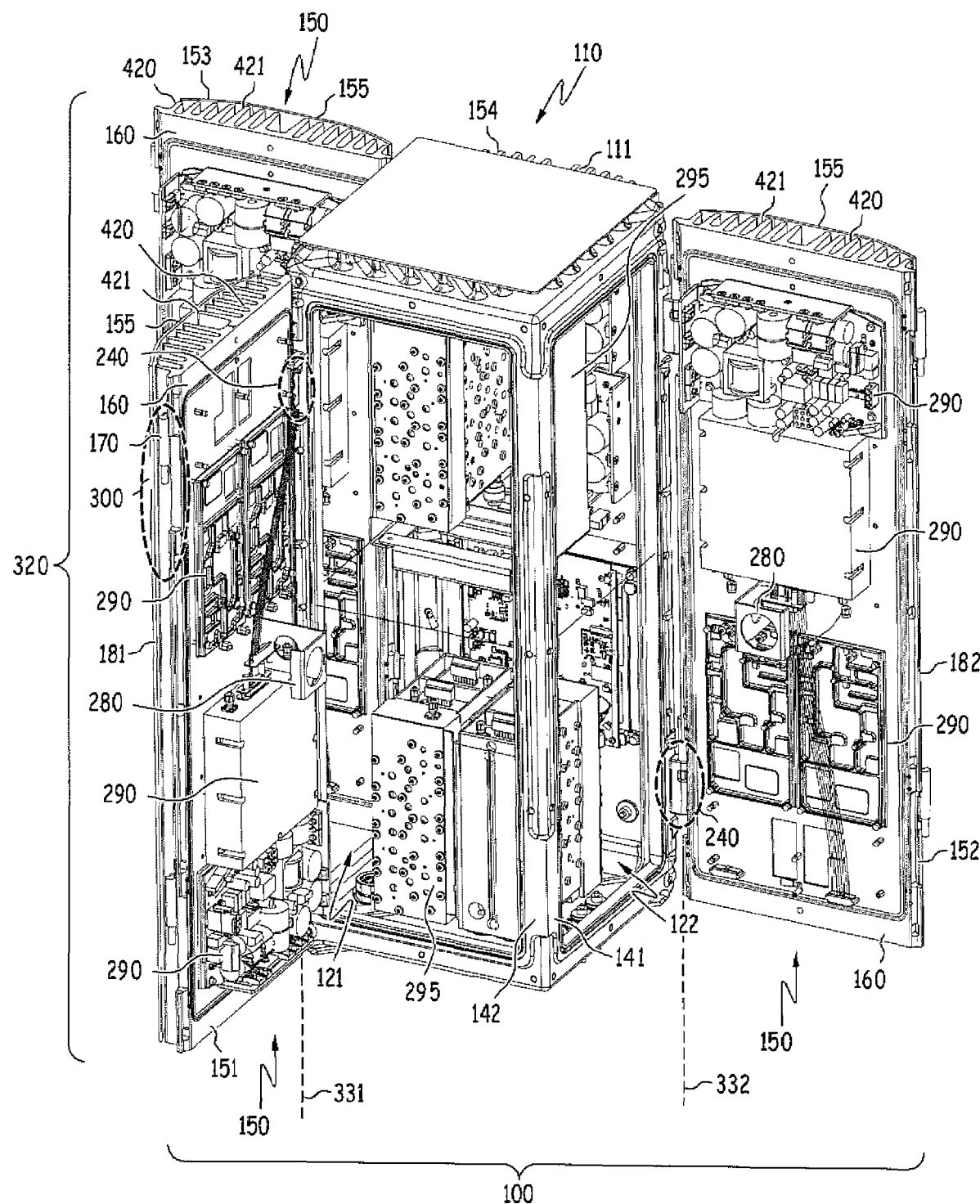
FIG. 2A is a schematic of an embodiment of a cabinet system.
Figure 2B:
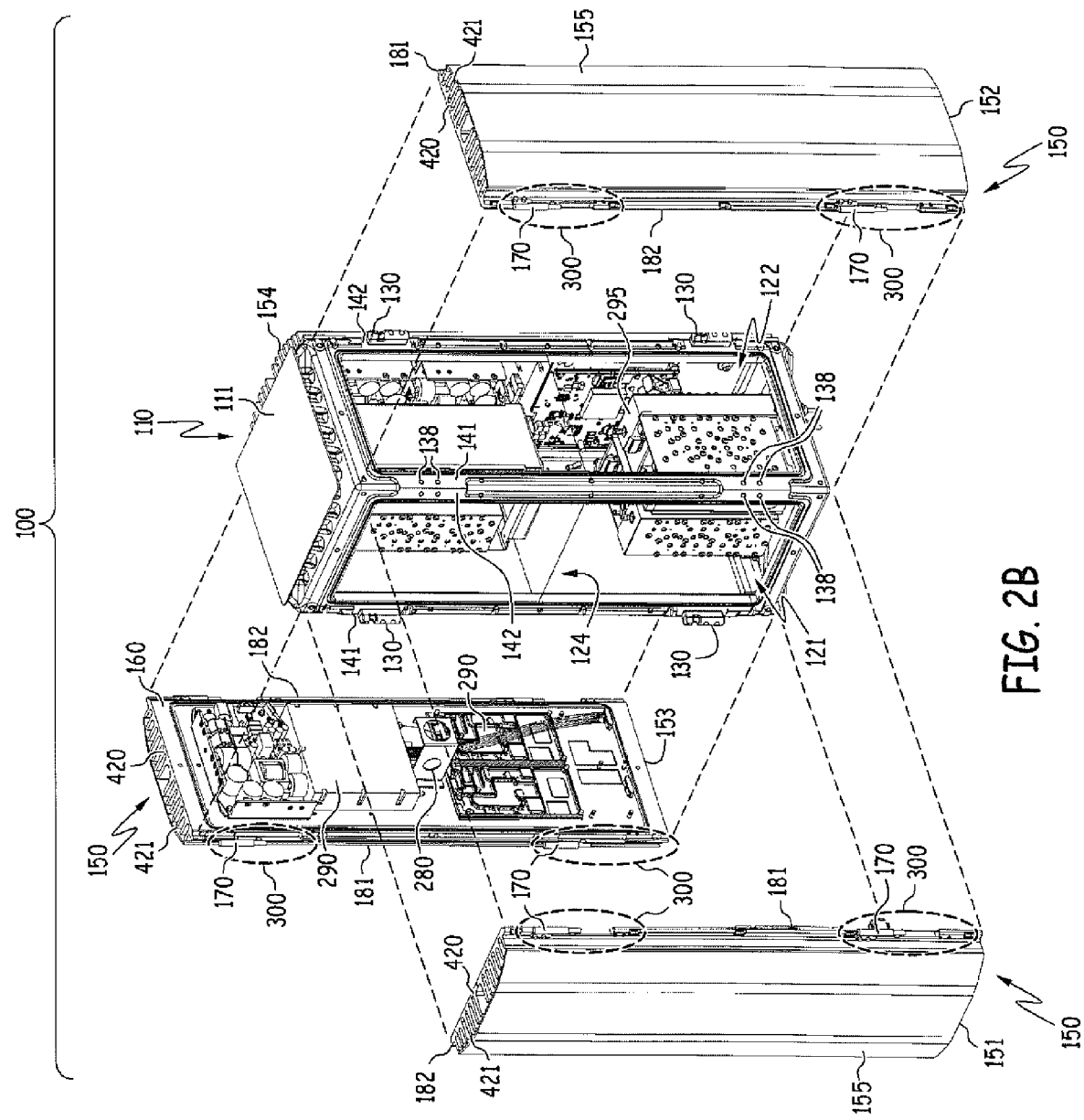
FIG. 2B is a schematic of an exploded view of an embodiment of a cabinet system of FIG. 2A.

FIG. 1 is a block diagram representative of an exploded view of an embodiment of a chassis 110 and a modular door 150. FIG. 2A is a schematic of an embodiment of a cabinet system 100. FIG. 2B is a schematic of an exploded view of an embodiment of the cabinet system 100 of FIG. 2A. The cabinet system 100 includes a plurality of modular doors 150, the chassis 110 and a radio frequency system represented generally by the numeral 320 (FIG. 2A). The radio frequency system 320 includes electronic components 290, such as power amplifiers and power supplies, on the modular doors 150 and a system control component 295 housed within the chassis 110.

The chassis 110 comprises a plurality of openings represented generally by the numeral 120. As shown in FIG. 1, the plurality of openings 120 include a first opening 121, a second opening 122, a third opening 123, and a fourth opening 124. The openings 121-124 are on four vertical sides of the chassis 110. Each opening 121-124 has two side edges 141 and 142, a third edge 143, and a fourth edge 144. The chassis 110 also has a surface 111 that is perpendicular to the side edges 141 and 142 and which conjoins the third edges 143 (FIG. 1) of the first opening 121, the second opening 122, the third opening 123, and the fourth opening 124. The chassis 110 also has a surface 111 that is perpendicular to the side edges 141 and 142 and which conjoins the fourth edges 144 (FIG. 1) of the first opening 121, the second opening 122, the third opening 123, and the fourth opening 124. As shown in FIG. 1, the surface 111 is parallel to the surface 112.

Chassis-hinge portions 130 are removably attached to one side edge 141 or 142 of each opening 121-124. The side edges 141 and 142 are also referred to herein as "edges 141 and 142." Screw holes 138 are visible on the side edge 141 or 142 to which the chassis-hinge portions 130 are not attached. The chassis-hinge portions are attached to either edge 141 or edge 142 by screwing the chassis-hinge portion 130 to the edge 141 or 142 using the screw holes 138.

As shown in FIG. 1, there are two chassis-hinge portions on the first edge 141 of the first opening 121 and two chassis-hinge portions on the second edge 142 of the second opening 122. The chassis-hinge portions 130 can be detached from the first edge 141 of the first opening 121 and attached to the second edge 142 of the first opening 121 during a reconfiguration of the cabinet system 100. Likewise, the chassis-hinge portions 130 can be detached from the second edge 142 of the second opening 122 and attached to the first edge 141 of the second opening 122 during a reconfiguration of the cabinet system 100. The cabinet system 100 is reconfigured as needed to allow full rotation of a modular door 150 that is attached via the chassis-hinge portions 130 to the edge 141 or 142 of the opening 120. In one implementation of this embodiment, each modular door 150 can be attached to any one of the plurality of openings 120.

Each modular door 150 comprises an outside surface 155 (FIGS. 2A and 2B), an inside surface 160 opposing the outside surface 155. Door-hinge receptacles represented generally by the numeral 300 are located on at least two edges 181 and 182 of each modular door 150 (FIG. 1).

The edge 181 is also referred to herein as "first edge 181." The edge 182 is also referred to herein as "second edge 182." The door-hinge receptacle 300 on the first edge 181 is also referred to herein as "first-door-hinge receptacle 301." The door-hinge receptacle 300 on the second edge 182 is also referred to herein as "second-door-hinge receptacle 302."

The door-hinge receptacles 300 receive door-hinge portions 170 in either section 305 or section 306 of the door-hinge receptacle 300. As shown in FIG. 1, the modular door 150 has door-hinge portions 170 in the section 305 of the door-hinge receptacles 300 (also referred to herein as door-hinge receptacles 302) on the second edge 182 of the modular door 150. In this configuration, the modular door 150 is attachable to the chassis-hinge portions 130 on the first edge 141 of the chassis 110. The chassis-hinge portions 130 attached to the first edge 141 of the chassis 110 is also referred to herein as "first-chassis-hinge portion." Likewise, the chassis-hinge portions 130 attached to the second edge 142 of the chassis 110 is also referred to herein as "second-chassis-hinge portion 130."

In one implementation of this embodiment, the door-hinge portions 170 are inserted into a section 305 of the door-hinge receptacles 300 on both the first edge 181 and the second edge 182 of the modular door 150. Such an embodiment is shown in FIGS. 2A and 2B.

Each door-hinge portion 170 that is positioned in a respective door-hinge receptacle 300 on the edge 181 and/or 182 of the modular door 150 is configured to mate with a respective chassis-hinge portion 130 on the one edge 141 or 142 of an opening 120 in the chassis 110. The mated chassis-hinge portion 130 and door-hinge portion 170 form a hinge represented generally by the numeral 240 (FIGS. 2A and 2B) to rotatably attach the modular door 150 to the opening 120 adjacent to the mated-chassis-hinge portion 130.

As shown in FIGS. 2A and 2B, the plurality of modular doors include a first modular door 151, a second modular door 152, a third modular door 153 and a fourth modular door 154. The fourth modular door 154 is shown in a closed position after the modular door 154 is rotated closed about a hinge (not visible in FIG. 2A) and bolted to the chassis 110.

As shown in FIG. 2A, the first modular door 151 rotates about a pivot axis 331 of the hinges 240 (only one hinge 240 is visible) on a first edge 141 of the opening 121 when the chassis-hinge portions 130 (FIG. 1) are attached on the first edge 141 of the opening 121. The chassis-hinge portions 130 on the first edge 141 of the first opening 121 mate with the door-hinge portions 170 on the second edge 182 of the first modular door 151 to form the hinge 240.

As is also shown in FIG. 2A, the second modular door 152 rotates about a pivot axis 332 of the hinges 240 (only one hinge 240 is visible) on the second edge 142 (FIG. 1) of the second opening 122 when the chassis-hinge portions 130 are attached on the second edge 142 of the second opening 121. The chassis-hinge portions 130 on the second edge 142 of the second opening 122 mate with the door-hinge portions 170 on the first edge 180 of the second modular door 152 to form the hinges 240.

In one implementation of this embodiment, there are screw holes 138 for attaching the chassis-hinge portions 130 on the third edge 143 and the fourth edge 144 rather than on the first edge 141 and second edge 142 of the openings 120 and the door-hinge receptacles 300 are on the third and fourth edges 183 and 184 of the modular doors 150. In this case, the modular door 150 will swing open from the chassis 110 in an upward direction or a downward direction rather than a sideways direction. In another implementation of this embodiment, there are screw holes 138 for attaching chassis-hinge portions on all the edges 181-184.

Figure 5:
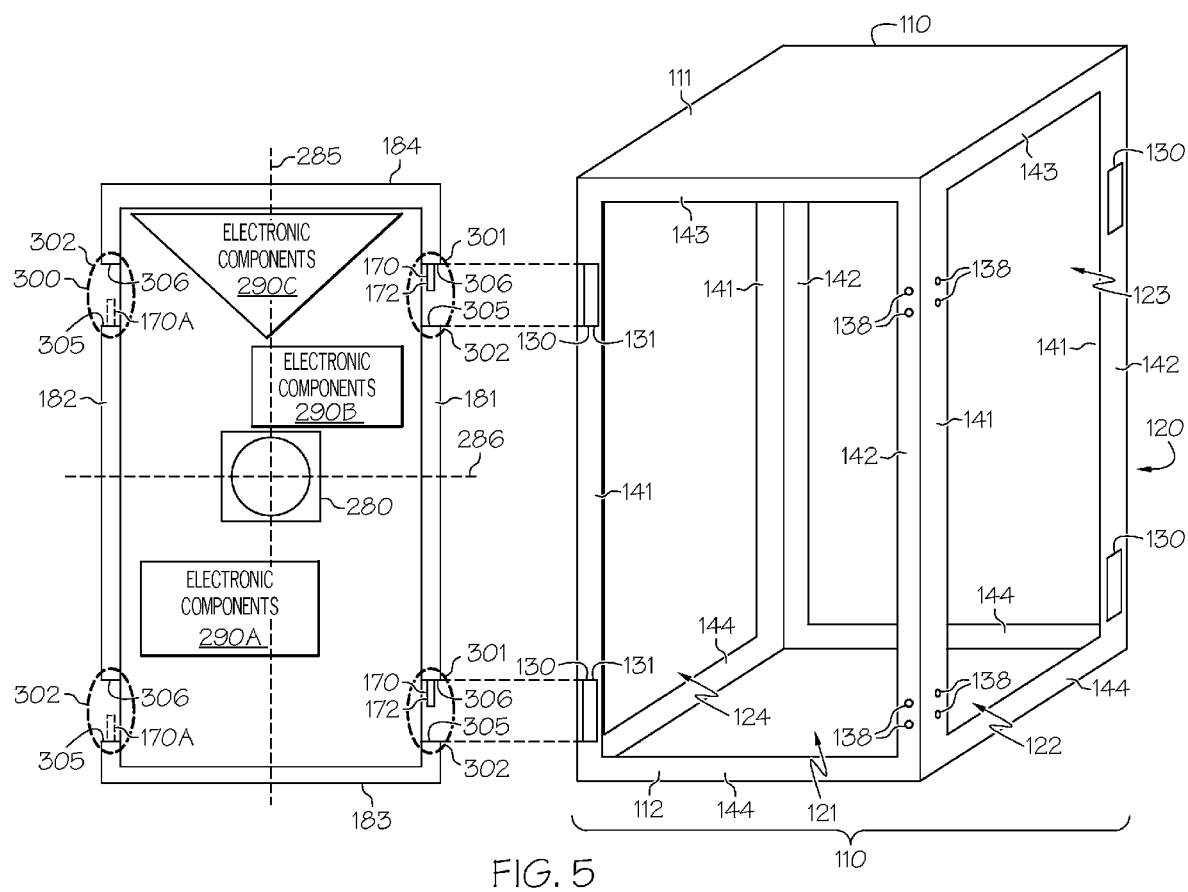
FIGS. 5 and 6 are block diagrams representative of an exploded view of different orientations of a modular door with respect to a chassis.
Figure 6:
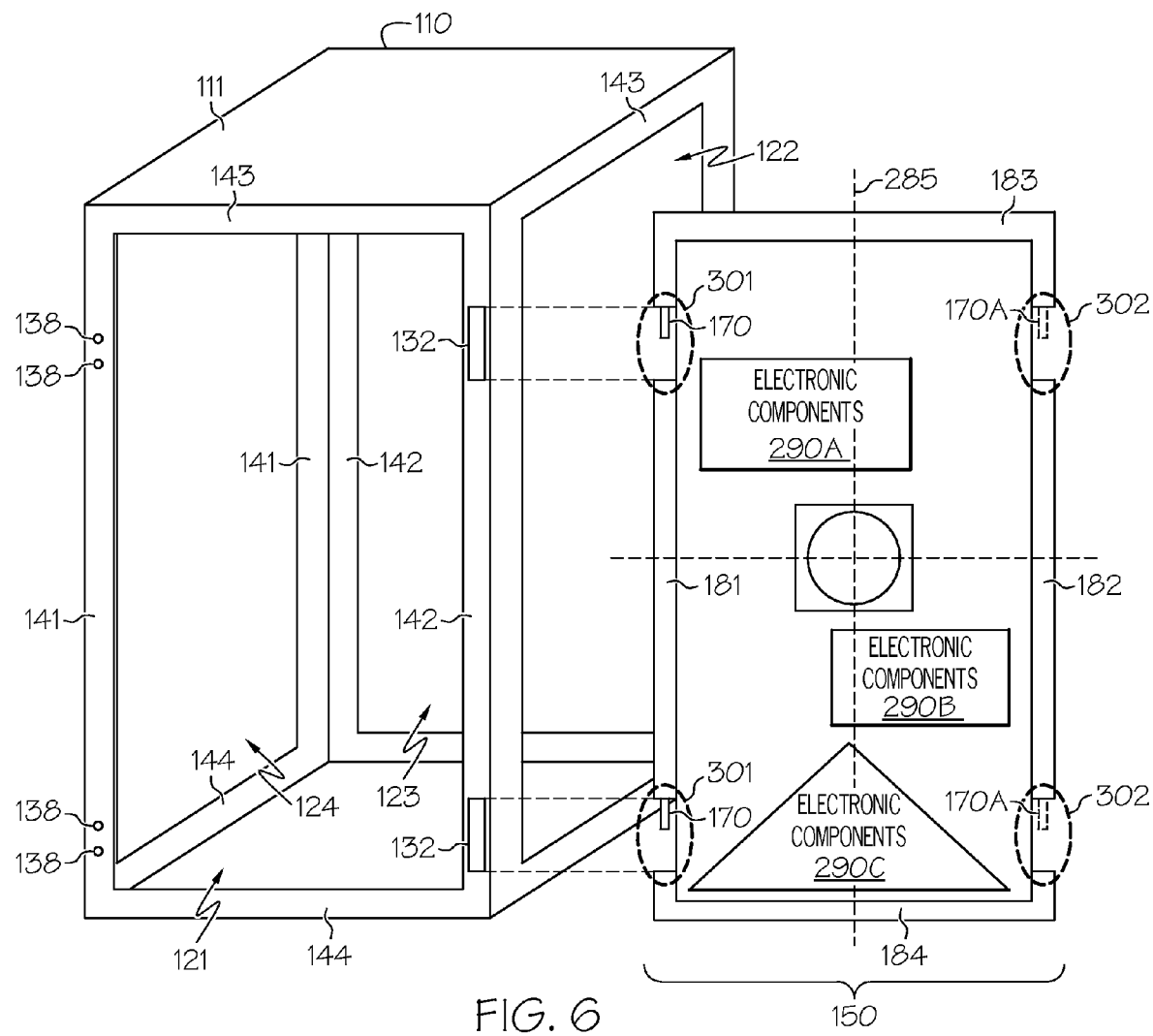

In FIG. 1, the modular door 150 has electronic components 290 (A-C) on an inside surface 160. The electronic components 290C are represented in a triangular shape in order to clearly indicate the orientation of the modular door 150 in FIG. 1 with respect to FIGS. 5 and 6 as described below with reference to FIGS. 5 and 6. Additionally, by using door-hinge portions 170 on only one edge of the modular door 150 in FIG. 1, the orientation of the modular door 150 in FIGS. 1, 5, and 6 is emphasized.

FIGS. 1 and 2A show an electrical-cable attachment 280 positioned at the center of one or more of the modular doors 150. The electrical-cable attachment 280 holds a cable (not shown in FIGS. 1 and 2A) that electrically connects at least one electronic component 290 to the system control component 295 housed in the chassis 110.

The electrical-cable attachment 280 is bisected by a plane shown in cross section from a plan view as line 285 in FIG. 1. The line 285 is parallel to the first and second edges 181-182 of the modular door 150. The electrical-cable attachment 280 is also bisected by a plane shown in cross section from a plan view as line 286. The line 286 is parallel to the third and fourth edges 183-184.

Figure 3:
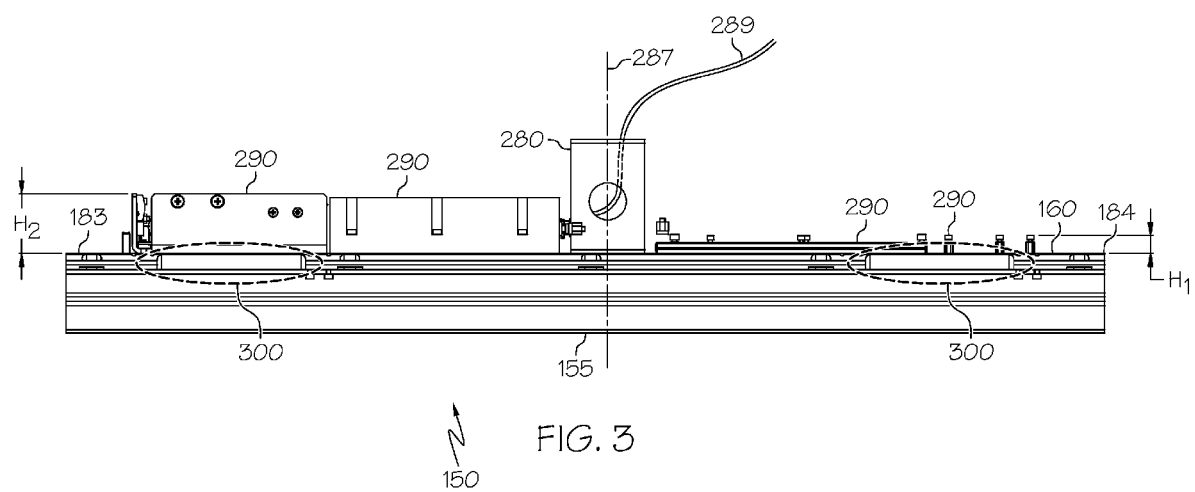
FIG. 3 is a side view of an embodiment of a modular door with an electrical-cable attachment positioned at the center of the modular door.

FIG. 3 is a side view of an embodiment of a modular door 150 with an electrical-cable attachment 280 holding a cable 289 positioned at the center of the modular door 150. The plane upon which the cross-section view of FIG. 3 is taken is indicated by section line 3-3 in FIG. 1. The section line 3-3 is also the line 285. The electrical-cable attachment 280 is bisected by a plane shown in cross section from an elevation view as line 287.

In the embodiment of FIG. 3, the electronic components 290 are arranged on the inside surface 160 to be one-fold symmetric in height about the plane that bisects the centrally located electrical-cable attachment 280. The electronic components 290 on one side of the bisecting line 287 protrude from the surface 160 by a height of Hi. The electronic components 290 on the other side of the bisecting line 287 protrude from the surface 160 by a height of $H_2$.

The modular doors 150 can be oriented in either a third-edge-up position or a third-edge-down position. By a judicious orientation of the modular doors 150, the electronic components 290 on one modular door are non-interfering with the electronic components 290 on any other modular door 150 when the modular doors are operably attached to the chassis. Interference between the electronic components 290 is avoided due to the one-fold symmetry in the height of the electronic components 290. As defined herein, interference is physical contact between of electronic components 290 on two different modular doors 150. In this manner, the electronic components 290 fill the maximum volume of space within the cabinet system 100 so a smaller chassis 110 can be used in the cabinet system 100.

In another implementation of this embodiment, the electronic components 290 are arranged on the inside surface 160 to be two-fold symmetric in height about two orthogonally positioned planes that each bisect the centrally located electrical-cable attachment 280. The electronic components 290 in the four quadrants defined by the two orthogonally positioned planes protrude from the surface 160 by four different heights, of which two heights, $H_1$, and $H_2$, are visible in FIG. 3. The lines 285 and 286 shown in FIG. 1 segment the modular door 150 into four exemplary quadrants. In one implementation of this embodiment, the electronic components 290 on one modular door 150 are duplicates of the electronic components 150 on at least one other modular door to provide redundancy of the functionality of the duplicated door 150. In such an embodiment, the electronic components 290 on one modular door 150 will not be active unless the electronic components 290 on the other modular door fail.

Figure 4:
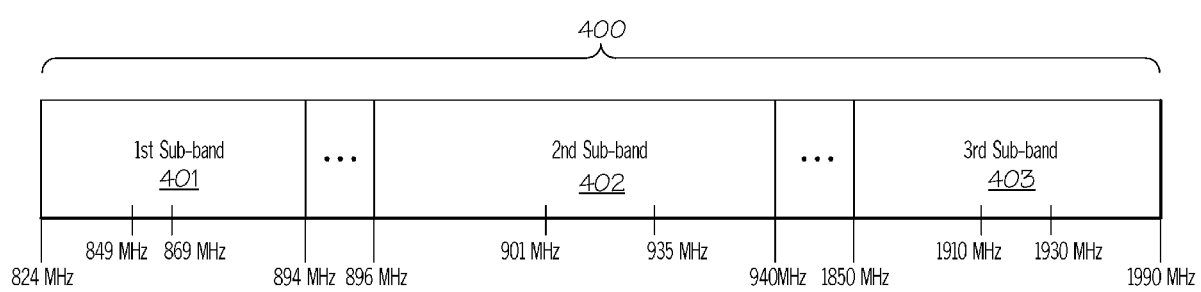
FIG. 4 is a block diagram showing an exemplary range of frequencies.

The radio frequency system 320 operates over a range of frequencies. FIG. 4 is a block diagram showing an exemplary range of frequencies 400. The range of frequencies 400 includes a first sub-band 401, a second sub-band 402, and a third sub-band 403. In one implementation of this embodiment, the first, second, and third sub-bands 401-403 are selected frequency ranges that encompass a portion of the range of frequencies 400 in the radio frequency system 320. In another implementation of this embodiment, the first, second, and third sub-bands 401-403 are selected frequency ranges that encompass the complete range of frequencies 400 in the radio frequency system 320. In another implementation of this embodiment, there are four sub-bands in the radio frequency frequencies 400 that encompass the complete range of frequencies 400 in the radio frequency system 320. As shown in FIG. 4, the first sub-band 401 is offset from the second sub-band 402 and the third sub-band 403. The second sub-band 402 is offset from the third sub-band 403. As shown in FIG. 4, the first sub-band 401 is offset and separated from the second sub-band 402.

In one implementation of an embodiment of the radio frequency system 320, the plurality of electronic components 290 operably attached to the inside surface 160 of the modular door 150 are operable within a selected frequency range, such as one of the sub-bands 401, 402 or 403. The system control components 295 housed within the chassis 110 include power supplies, filters and other electronic components common to all the modular doors.

In an exemplary implementation, the electronic components 290 attached to the first modular door 151 include the electronic components 290 operable within the first sub-band 401, while the electronic components 290 attached to the second modular door 152 include the electronic components 290 operable within the second sub-band 402. In another implementation of this embodiment, the electronic components 290 attached to the third modular door 153 include the electronic components 290 operable within the third sub-band 403 of the range of frequencies.

In yet another implementation of this embodiment, the electronic components 290 on the first, second and third modular doors 151-153 are operable at frequencies in a respective sub-band 401-403 to convert radio frequency signals to digital signals, to convert digital signals to radio frequency signals and to amplify the radio frequency signals. In this manner, each modular door 150 is radio frequency band specific.

In a first exemplary case, the first sub-band 401 is a cellular A and B band that covers frequencies from 824 MHz to 849 MHz in the uplink and 869 MHz to 894 MHz in the downlink. In this case, an exemplary second sub-band 402 is an enhanced specialized mobile radio (ESMR) 900 band that covers frequencies from 896 MHz to 910 MHz in the uplink and 935 MHz to 940 MHz in the downlink. The exemplary third sub-band 403 is a personal communication system (PCS) band that covers frequencies from 1850 Hz to 1910 Hz in the uplink and 1930 MHz to 1990 MHz in the downlink.

In another implementation of this embodiment, one of the sub-bands, such as sub-band 401, is an ESMR 800 band that covers frequencies from 806 MHz to MHz in the uplinik and 851 MHz to 866 MHz in the downlinik.

The electronic components 290 for the cellular A and B band on the first modular door 151 include a power amplifier, up to two digital audio reconstruction technology (DART) boards, an interface to power and connect the DART boards, and a power supply for the frequency range of the first sub-band 401. The electronic components 290 for the PCS band on the second modular door 152 include a power amplifier, DART boards, an interface for the DART boards, and a power supply for the frequency range of the second sub-band 402. The electronic components 290 on the third modular door 153 for the PCS band include a power amplifier, two DART boards, an interface for the DART boards, and a power supply for the frequency range of the third sub-band 403. Thus, when a subsystem of the radio frequency system 320 on the modular door 150 is composed many electronic components 290, all the subsystem electronic components 290 are linked together on a common modular door 150. In this manner, the number of interconnections between the electronic components on a modular door and the electronic components in the chassis 110 or on other modular doors 150 are minimized. In one implementation of this embodiment, at least one modular door 150 includes duplicate electronic components 290 to one other modular door 150 to provide redundancy of the functionality of the duplicated door.

In another implementation of this embodiment, a cabinet system 100 can include a radio frequency system 320 for a neutral-host provider requiring high-power PCS-only coverage from a tri-band remote. In this case, electronic components 290 on each modular door 150 in the radio frequency system 320 would handle a different sub-band portion of the PCS spectrum allowing higher per-band output power than would be possible with a single power amplifier in this form factor.

In an outdoor cabinet system 100 with multiple serviceable and replaceable modular doors 150, it is possible for every modular door 150 to be placed into any opening 120. When modular doors 150 fit in any opening 120 of the chassis 110, a customer at a remote site orders a replacement door based only the specific door components, not the slot into which the door fits.

Sometimes customers install the doors with a third edge of the door in an up orientation, which is referred to herein as the "right side up," while other times customers install doors with a third edge of the door in a down orientation, which is referred to herein as the "up-side down." Some customers install the doors with a right mounted hinge while other customers require a left mounted hinge. In a system with three different types of non-modular doors for a tri-band radio frequency system, the customers need to choose a door from 12 different catalog numbers, as opposed to three numbers with the symmetrical doors, as shown in Table 1. Additionally, the customer's central procurement department would need to track the type, orientation and hinge placement of every slot in every chassis, or send a field service technician to the site to determine what replacement part is necessary.

TABLE 1

| Catalog No. | Modular door type (sub-band type, orientation, hinge side) |
| --- | --- |
| 1 | Type 1, Right Side Up, Left Hinge |
| 2 | Type 1, Right Side Up, Right Hinge |
| 3 | Type 1, Upside Down, Left Hinge |
| 4 | Type 1, Upside Down, Right Hinge |
| 5 | Type 2, Right Side Up, Left Hinge |
| 6 | Type 2, Right Side Up, Right Hinge |
| 7 | Type 2, Upside Down, Left Hinge |
| 8 | Type 2, Upside Down, Right Hinge |
| 9 | Type 3, Right Side Up, Left Hinge |
| 10 | Type 3, Right Side Up, Right Hinge |
| 11 | Type 3, Upside Down, Left Hinge |
| 12 | Type 3, Upside Down, Right Hinge |

The embodiments of the symmetrically interchangeable modular doors 150 described herein simplify the ordering process for a customer. These modular doors 150 have symmetrically mounted components and cable input/output ports along with easily changeable hinge features allowing doors of Type 1, Type 2 or Type 3 to fit upside down or right side up. Additionally the modular doors 150 are easily configurable on site to include either left or right mounted hinges.

FIGS. 5 and 6 are block diagrams representative of an exploded view of different orientations of a modular door 150 with respect to a chassis 110. The orientation of the modular door 150 in FIG. 5 differs from the orientation of FIG. 1 in that the modular door has been rotated 180° about the intersection of lines 285 and 286 (FIG. 1).

In FIGS. 1, 5 and 6, he door-hinge receptacles 300 on two edges of the modular doors 150 include the first-door-hinge receptacle 301 positioned on the first edge 181 of the modular door 150 and a second-door-hinge receptacle 302 positioned on the second edge 182 of the modular door 150.

In FIG. 5, the modular door 150 is in a third-edge-down position since the door-hinge portions 170 (also referred to herein as "first-door-hinge portions 171") positioned in the first-door-hinge receptacles 301 on the first edge 182 of the modular door 150 are mated to first-chassis-hinge portion 131 on a first edge 141 of the opening 120.

This is in contrast to the orientation of the modular door 150 shown in FIG. 1. As shown in FIG. 1, the modular door 150 is in a third-edge-up position when the door-hinge portions 170 (also referred to herein as "second-door-hinge portions 172") positioned in the second-door-hinge receptacles 302 on the second edge 182 of the modular door 150 are mated to first-chassis-hinge portion 131 on a first edge 141 of the opening 120. The triangularly shaped electronic components 290C point in the opposite directions in FIGS. 1 and 5 to clearly show the difference in the orientation of the modular door 150. Also, the door-hinge portion 170 from FIG. 1 is shown in dashed lines and numerically labeled as 170A in FIG. 5 in order to emphasize the difference in the orientation of the modular door 150 in FIGS. 1 and 5.

In FIG. 6, the modular door 150 is in a third-edge-up position as it was in FIG. 1, but the modular door 150 in FIG. 6 pivots about an axis at the second edge 142, while the modular door 150 in FIG. 1 pivots about an axis at first edge 141. As shown in FIG. 6, the modular door 150 is in a third-edge-up position when the door-hinge portions 170 positioned in the first-door-hinge receptacles 301 on the first edge 181 of the modular door 150 mate to second-chassis-hinge portions 132 on a second edge 142 of the opening 120. The triangularly shaped electronic components 290C point in the same direction in FIGS. 1 and 6 to clearly show the similarity in the orientation of the modular door 150. Also, the door-hinge portion 170 from FIG. 1 is shown in dashed lines and numerically labeled as 170A to show the difference in the orientation of the modular door 150 in FIGS. 1 and 6.

In one implementation of this embodiment, a heat sink forms a main body of the modular door 150. This is useful when the electronic components 290 require significant power dissipation and provisions must be made for adequate cooling. An implementation of an embodiment of a heat sink 420 is shown in FIGS. 2A and 2B. The fin surfaces 420 of the heat sinks 420 are visible between the outside surface 155 and the inside surface 160 of the modular doors 150. The heat sinks 420 have a fin surfaces 420 and a substantially flat inside surface, which forms the inside surface 160 of at least a portion of the modular door 150. The fin surface 421 forms and/or contacts at least a portion of the outside surface 155 of the modular door 150. In this manner, the heat generated by the electronic components 290 operably attached to the substantially flat surface 160 is thermally conducted to the fin surface 420 for dissipation outside the chassis 110.

Figure 7:
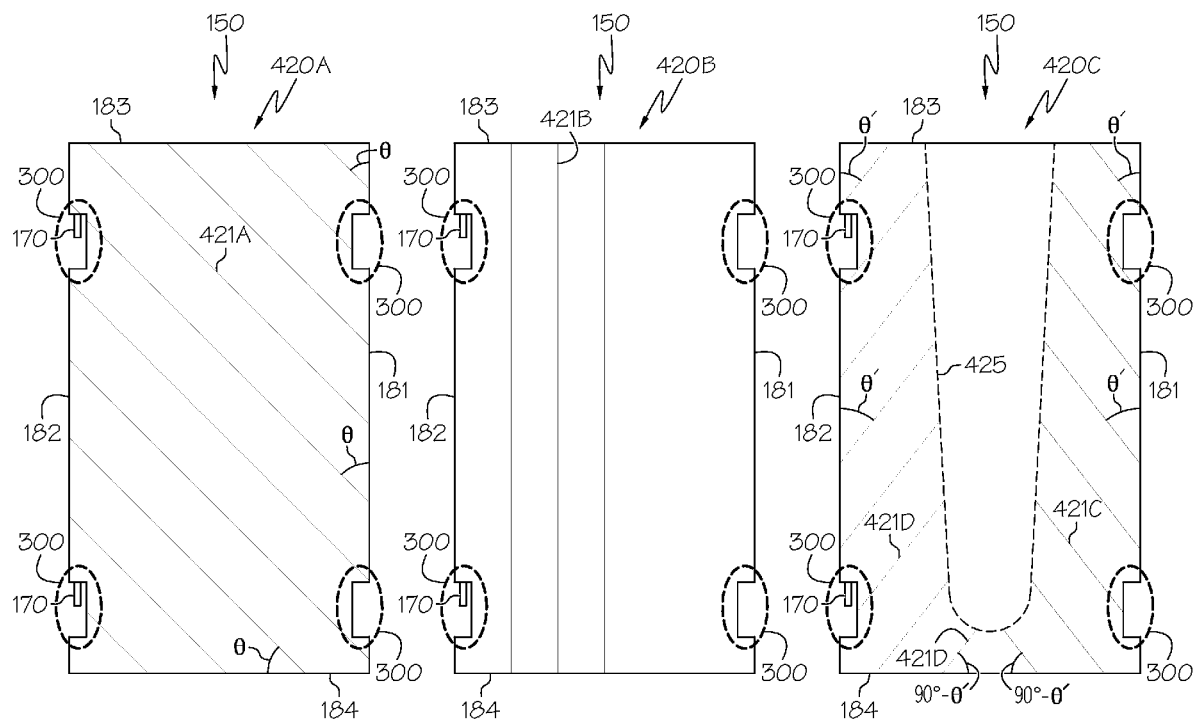
FIGS. 7A-7C show embodiments of heat sink configurations.

FIGS. 7A-7C show embodiments of heat sink configurations. As shown in FIGS. 7A, 7B, and 7C, the fins 421 can have one of several configurations. In FIG. 7A, the fins represented generally by the numeral 421A of the heat sink 420A have an angled configuration in which the fins 421A are at an angle $\Theta$ to the first edge 181 or the fourth edge 184. A portion of the fins 421A at the angle $\Theta$ to the first edge 181 extend from the first edge 181 to the second edge 182. Another portion of the fins 421A at the angle $\Theta$ to the first edge 181 extend from the first edge 181 to the third edge 183. The fins 421A at the angle $\Theta$ to the fourth edge 184 extend from the fourth edge 184 to the second edge 182. In one implementation of this embodiment, the angel $\Theta$ is 45 degrees.

In FIG. 7B, the fins represented generally by the numeral 421B of the heat sink 420B have a vertical configuration in which the fins 421B run parallel to the first edge 181. The fins 421B extend from the third edge 183 to the fourth edge 184.

In FIG. 7C, the fins represented generally by the numerals 421C and 421D form an open-chevron configuration on the heat sink 420C. The fins 421 C run at an angle $\Theta'$ to the first edge 181 or at an angle $90°-\Theta'$ to the fourth edge 184. The fins 421C extend from the first edge 181 to an open area represented generally by the numeral 425. There are no fins in the open area 425 of the heat sink 420C. A portion of the fins 421C at the angle $\Theta'$ to the first edge 181 extend from the first edge 181 to the open area 425. Another portion of the fins 421C at the angle $\Theta'$ to the first edge 181 extend from the first edge 181 to the third edge 183. The fins 421C at the angle $90°-\Theta'$ to the fourth edge 184 extend from the fourth edge 184 to the open area 425.

The fins 421D extend from the second edge 182 to the open area 425. A portion of the fins 421D at the angle $\Theta'$ to the second edge 182 extend from the second edge 182 to the open area 425. Another portion of the fins 421D at the angle $\Theta'$ to the second edge 182 extend from the second edge 182 to the third edge 183. The fins 421D at the angle $90°-\Theta'$ to the fourth edge 184 extend from the fourth edge 184 to the open area 425. In one implementation of this embodiment, the angel $\Theta'$ is 45 degrees.

Figure 8:
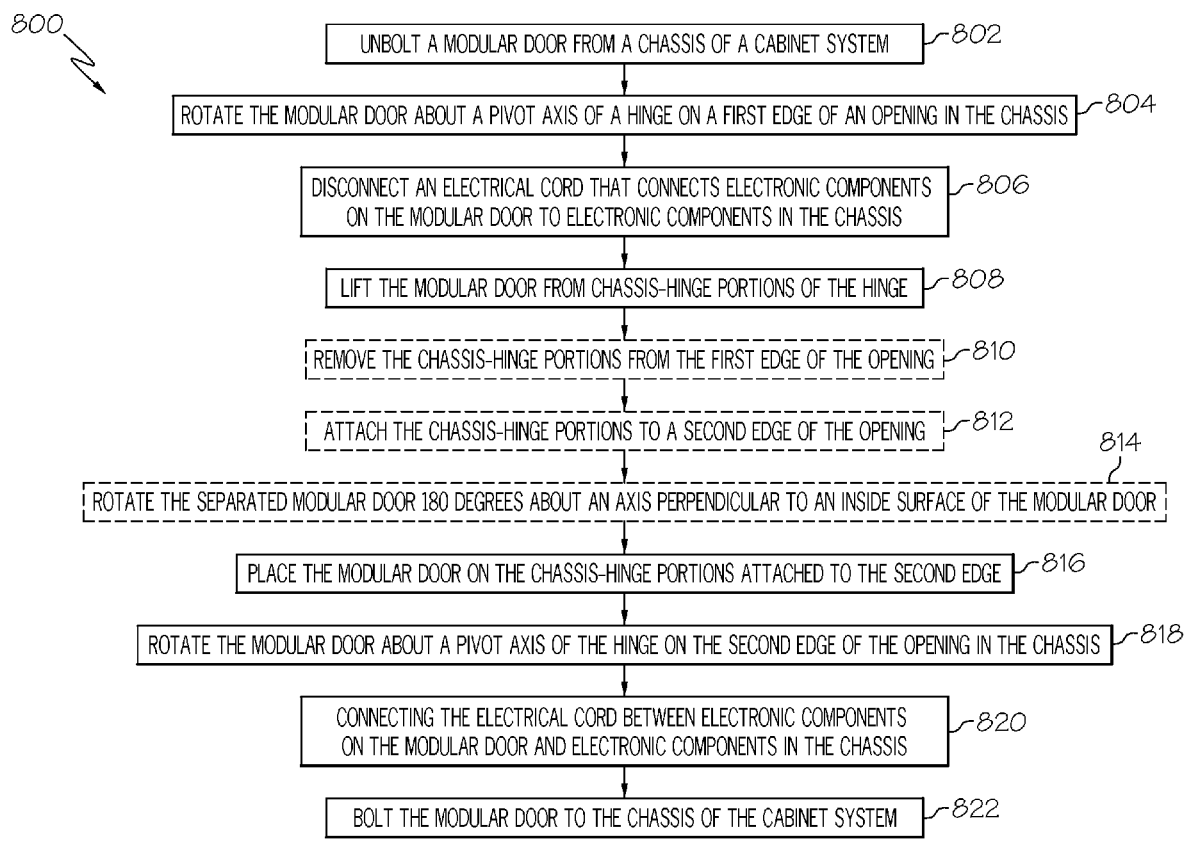
FIG. 8 is a flow diagram of one embodiment of a method to reconfigure a cabinet system in accordance with the present invention.

FIG. 8 is a flow diagram of one embodiment of a method 800 to reconfigure a cabinet system 100 in accordance with the present invention. Method 800 to reconfigure a cabinet system 100 is described with reference to the cabinet system 100 shown in FIGS. 2 and 2B although method 800 is applicable to other embodiments of the cabinet system. Other methods of reconfiguring the cabinet system 100 are possible as is understandable from reading this specification.

At block 802, a modular door 150 is unbolted from the chassis 110 of the cabinet system 100. At block 804, the modular door 150 is rotated about a pivot axis 331 of a hinge 240 on a first edge 141 of an opening 120 in the chassis 110. The modular door 150 is now in an open position to allow access to the cabinet system 100 through the opening 120 in the chassis 110. At block 806, an electrical cord 289 connecting electronic components 290 on the modular door 150 to electronic components 290 in the chassis 110 is disconnected responsive to the rotating the modular door 150 about the pivot axis of the hinge on the first edge 141. In one implementation of this embodiment, there is no electrical cord 289 connecting electronic components 290 on the modular door 150 to electronic components 290 in the chassis 110 and block 806 does not occur.

At block 808, the modular door 150 is lifted from chassis-hinge portions 130 of the hinge 240. The chassis-hinge portions 130 are removably attached at the first edge 141 of the opening 120. The lifting separates the modular door 150 from the chassis 110.

In one implementation of this embodiment, the method to reconfigure a cabinet system 100 requires the replacement of a first modular door with a second modular door. For example, the first modular door includes electronic components 290 in a first subband, and the second modular door includes electronic components 290 in a second subband. After the first modular door is lifted from chassis-hinge portions 130 of the hinge 240, the second modular door is placed on the chassis-hinge portions attached to the first edge on the same chassis-hinge portion 130. In this manner, a hinge on the first edge of the opening is formed with the second modular door and steps 820 and 822 (described below) are implemented. In an alternate implementation of this embodiment, steps 810-812 and 816 (described below) are implemented for the second modular door so the second modular door is attached by a hinge to the second edge. In yet another implementation of this embodiment, steps 814 and 816 (described below) are implemented for the second modular door so the second modular door is in a different orientation than that of the first modular door.

Blocks 810 and 812 are optional and are implemented based on the required pivotal axis of the modular door 150 after the reconfiguration. If the modular door 150 is to be rotatable about a different axis, blocks 810 and 812 are implemented. At block 810, the chassis-hinge portions 130 are removed from the first edge 141 of the opening 120. At block 812, the chassis-hinge portions 130 are attached to a second edge of the opening.

Block 814 is also optional and is implemented based on the required orientation of the modular door 150 after the reconfiguration. It the orientation of the modular door 150 is to be changed between a third-edge up and a third-edge down position, block 814 is implemented. At block 814, the separated modular door 150 is rotated 180° about an axis perpendicular to an inside surface 160 of the modular door 150 so that the vertical orientation of modular door 150 is reversed when the modular door 150 is placed on the chassis-hinge portions 130. The axis formed by the two orthogonal planes that intersect a centrally located electrical-cable attachment as described above with reference to FIG. 1. The axis is perpendicular to an inside surface 160 of the modular door 150 and intersects the intersection of lines 285 and 286 in FIG. 1.

At block 816, the modular door 150 is placed on the chassis-hinge portions 130 attached to the second edge, so that a hinge is formed on the second edge of the opening 120.

At block 818, the modular door is rotated about a pivot axis of the hinge 240 on the second edge 142 of the opening 120 in the chassis 110 responsive to the placing the modular door 150 on the chassis-hinge portions 132 (FIG. 6) attached to the second edge 142.

At block 820, the electrical cord 289 is connected between the electronic components 290 on the modular door 150 and electronic components, such as system control component 295 housed within the chassis 110, responsive to the placing the modular door 150 on the chassis-hinge portions 130 attached to the second edge 142. In one implementation of this embodiment, there is no electrical cord 289 connecting electronic components 290 on the modular door 150 to electronic components 290 in the chassis 110 and block 820 does not occur. At block 822, the modular door 150 is bolted to the chassis 110 of the cabinet system 100.

As is understandable by one skilled in the art and from reading this specification, the plurality of openings can have chassis-hinge portions on a first edge, a second edge, a third edge, and a fourth edge of the openings, and the plurality of modular doors can comprise door-hinge portions on a first edge, a second edge, a third edge, and a fourth edge of each modular door, so that each modular door is attachable to an opening in a manner in which the modular door is able to swing outward from the opening from any of a first hinge, a second hinge, a third hinge and a fourth hinge positioned on a respective first edge, second edge, third edge, and fourth edge of the opening.

Although specific embodiments have been illustrated and described herein, it will be appreciated that any combination of the various embodiments can be implemented.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A cabinet system comprising:
a chassis comprising a plurality of openings, each opening having chassis-hinge portions on one of two edges of the openings, the chassis-hinge portions removably attachable to the one edge of the two edges;
a plurality of modular doors, each of the plurality of modular doors comprising:
an outside surface having a first edge, a second edge, and a third edge;
an inside surface opposing the outside surface; and
door-hinge receptacles on at least the first edge and the second edge of each of the plurality of modular doors, the door-hinge receptacles to receive door-hinge portions,
wherein each door-hinge portion positioned in a respective door-hinge receptacle on one edge of the plurality of modular doors is configured to mate with a respective chassis-hinge portion on the one edge of one of the plurality of openings, wherein the mated chassis-hinge portion and door-hinge portion form a hinge to rotatably attach the modular door to the one of the plurality of openings adjacent to the mated-chassis-hinge portion, and wherein the modular doors are orientable in either a third-edge-up position or a third-edge-down position; and
at least one radio frequency system comprising:
a plurality of electronic components operably attached to the inside surface of at least one of the plurality of modular doors, wherein the at least one radio frequency system operates over a range of frequencies.

2. The cabinet system of claim 1, wherein each of the plurality of modular doors rotates about a pivot axis of the hinge on a first edge of the opening when the chassis-hinge portions are attached on the first edge of the opening, and each of the plurality of modular doors rotates about a pivot axis of the hinge on a second edge of the opening when the chassis-hinge portions are attached on the second edge of the opening.

3. The cabinet system of claim 1, wherein the radio frequency system further comprises:
at least one system control component housed within the chassis, wherein at least one of the electronic components on at least one of the plurality of modular doors is electrically connected to the system control component.

4. The cabinet system of claim 3, further comprising:
an electrical-cable attachment positioned at the center of at least one of the plurality of modular doors to hold a cable connecting at least one electronic component operably attached to the at least one of the plurality of modular doors to at least one system control component housed in the chassis, wherein each electronic component attached to one of the at least one of the plurality of modular doors protrudes from the inside surface by a height, wherein the electronic components are arranged on the inside surface to be one-fold symmetric in height about a plane that intersects the centrally located electrical-cable attachment.

5. The cabinet system of claim 4, wherein the door-hinge receptacles on the first edge and the second edge of each of the plurality of modular doors comprise:
first-door-hinge receptacles positioned on the first edge of each of the plurality of modular doors; and
second-door-hinge receptacles positioned on the second edge of each of the plurality of modular doors, wherein each of the plurality of modular doors further includes:
third edge perpendicular to the first edge and the second edge;
wherein each of the plurality of modular doors is in the third-edge-down position when first-door-hinge portions positioned in the first-door-hinge receptacles on the first edge of each of the plurality of modular doors mate to first-chassis-hinge portions on a first edge of the opening.

6. The cabinet system of claim 5, wherein each of the plurality of modular doors is in the third-edge-up position when second-door-hinge portions positioned in the second-door-hinge receptacles on the second edge of each of the plurality of modular doors mate to first-chassis-hinge portion on the first edge of the opening.

7. The cabinet system of claim 5, wherein the electronic components on one of the plurality of modular doors are non-interfering with the electronic components on any other one of the plurality of modular doors due to the one-fold symmetry in the height of the electronic components when the plurality of modular doors are operably attached to the chassis.

8. The cabinet system of claim 1, further comprising:
an electrical-cable attachment positioned at the center of at least one of the plurality of modular doors to hold a cable connecting at least two electronic components in the chassis, wherein each electronic component attached to one of the plurality of modular doors protrudes from the inside surface by a height, wherein the electronic components are arranged on the inside surface to be two-fold symmetric in height about two orthogonal planes that intersect the centrally located electrical-cable attachment.

9. The cabinet system of claim 1, wherein the plurality of openings comprises four openings.

10. The cabinet system of claim 1, wherein each of the plurality of modular doors can be attached to any one of the plurality of openings of the chassis.

11. The cabinet system of claim 1, wherein the electronic components on one of the plurality of modular doors are duplicates of the electronic components on at least one other of the plurality of modular doors to provide redundancy of the functionality of the duplicated modular door.

12. The cabinet system of claim 1, wherein the electronic components attached to a first modular door comprise the electronic components required for a first sub-band of the range of frequencies, and the electronic components attached to a second modular door comprise the electronic components required for a second sub-band of the range of frequencies, wherein the first sub-band is offset from the second sub-band.

13. The cabinet system of claim 12, wherein the electronic components attached to a third modular door comprise the electronic components required for a third sub-band of the range of frequencies, the third sub-band offset from the first sub-band and the second sub-band, the first, second, and third sub-bands encompassing the range of frequencies in the radio frequency system.

14. The cabinet system of claim 1, wherein the plurality of modular doors further comprise:
a heat sink forming a main body of each of the plurality of modular doors, the heat sink having a fin surface and a substantially flat surface, the fin surface forming at least a portion of the outside surface of each of the plurality of modular doors and the substantially flat surface forming an inside surface of at least a portion of each of the plurality of modular doors, wherein heat generated by the electronic components is thermally conducted to the fin surface for dissipation outside the chassis when the electronic components are operably attached to the substantially flat surface and the first hinge and second hinge secure each of the plurality of modular doors to the chassis to enclose the electronic components.

15. The cabinet system of claim 14, wherein the fins have one of a vertical configuration, an angled configuration, and an open-chevron configuration.

16. A modular door to fit within an opening in a chassis the modular door having a first edge, a second edge, and a third edge, and the modular door comprising:
a heat sink forming a main body of the modular door, the heat sink having a fin surface and a substantially flat surface, the fin surface forming at least a portion of the outside surface of the modular door and the substantially flat surface forming an inside surface of at least a portion of the modular door; and
door-hinge receptacles on at least the first edge and the second edge of the modular door, the door-hinge receptacles to receive door-hinge portions, wherein heat generated by electronic components is thermally conducted to the fin surface for dissipation outside the chassis when the electronic components are operably attached to the substantially flat surface and the modular door is affixed to cover an opening in the chassis to enclose the electronic components, and wherein the modular door is orientable in either a third-edge-un position or a third-edge-down position.

17. The modular door of claim 16, further comprising:
the plurality of electronic components operably attached to the inside surface of the modular door, the electronic components operable at a selected frequency range.

18. The modular door of claim 17, further comprising:
an electrical-cable attachment positioned at the center of the modular door, wherein each electronic component attached to the modular door protrudes from the inside surface by a height, wherein the electronic components are arranged on the inside surface to be one-fold symmetric in height about a plane that intersects the centrally located electrical-cable attachment.

19. The modular door of claim 16, further comprising:
an electrical-cable attachment positioned at the center of the modular door, wherein each electronic component attached to each modular door protrudes from the inside surface by a height, wherein the electronic components are arranged on the inside surface to be two-fold symmetric in height about two orthogonal planes that intersect the centrally located electrical-cable attachment.

20. Modular doors to enclose electronic components in a chassis, each modular door having a first edge, a second edge, and a third edge, and each modular door comprising:
a plurality of electronic components operably attached to an inside surface of the modular door, wherein the electronic components on each of the modular doors are operable within a respective different selected frequency range within a range of frequencies, the modular doors having door-hinge receptacles on at least the first edge and the second edge, wherein the modular door is orientable in either a third-edge-up position or a third-edge-down position.

21. The modular doors of claim 20, wherein the electronic components attached to a first modular door are operable within a first sub-band of the range of frequencies, and the electronic components attached to a second modular door are operable within a second sub-band of the range of frequencies, wherein the first sub-band is offset from the second sub-band.

22. The modular doors of claim 21, wherein the electronic components attached to a third modular door are operable within a third sub-band of the range of frequencies, wherein the third sub-band is offset from the first sub-band and the second sub-band.

23. The modular doors of claim 22, wherein the first, second, and third sub-bands completely encompass the range of frequencies.

24. A cabinet system comprising:
a chassis comprising a plurality of openings having chassis-hinge portions removably attached on one of two edges of the openings; and
a plurality of modular doors, each of the plurality of modular doors comprising:
an outside surface having a first edge, a second edge, and a third edge;
an inside surface opposing the outside surface; and
door-hinge receptacles on at least the first edges and the second edge of each of the plurality of modular doors, the door-hinge receptacles to receive door-hinge portions,
wherein each door-hinge portion positioned in a respective door-hinge receptacle on one edge of the plurality of modular doors is configured to mate with a respective chassis-hinge portion on the one edge of one of the plurality of openings, wherein the mated chassis-hinge portion and door-hinge portion form a hinge to rotatably attach the modular door to the one of the plurality of openings adjacent to the mated-chassis-hinge portion, and wherein the modular doors are orientable in either a third-edge-up position or a third-edge-down position.

25. The cabinet system of claim 24, further comprising:
a plurality of electronic components operably attached to the inside surface of at least one of the plurality of modular doors.

26. The cabinet system of claim 25, further comprising:
an electrical-cable attachment positioned at the center of at least one of the plurality of modular doors to hold a cable connecting at least two electronic components in the chassis, wherein each electronic component attached to the at least one of the plurality of modular doors protrudes from the inside surface by a height, wherein the electronic components are arranged on the inside surface to be one-fold symmetric in height about a plane that intersects the centrally located electrical-cable attachment.

27. The cabinet system of claim 24, wherein the door-hinge portions on two edges of each of the plurality of modular doors comprise:
a first-door-hinge receptacle positioned on the first edge of each of the plurality of modular doors; and
a second-door-hinge receptacle positioned on the second edge of each of the plurality of modular doors, wherein each of the plurality of modular doors further includes:
the third edge perpendicular to the first edge and the second edge;
wherein each of the plurality of modular doors is in the third-edge-down position when first-door-hinge portions positioned in the first-door-hinge receptacles on the first edge of each of the plurality of modular doors mate to first-chassis-hinge portions on a first edge of the opening.

28. The cabinet system of claim 27, wherein each of the plurality of modular doors is in a third-edge-up position when the second-door-hinge portions positioned in the second-door-hinge receptacles on the second edge of each of the plurality of modular doors mate to first-chassis-hinge portion on a first edge of the opening.

29. The cabinet system of claim 27, further comprising
plurality of electronic components operably attached to the inside surface of each of the plurality of modular doors, wherein each electronic component attached to one of the plurality of modular doors protrudes from the inside surface by a height, wherein the electronic components are arranged on the inside surface to be one-fold symmetric in height, wherein the electronic components on one of the plurality of modular doors are non-interfering with the electronic components on any other of the plurality of modular doors due to the one-fold symmetry in the height of the electronic components when the modular doors are operably attached to the chassis.

* * * * *